United States Patent [19]
Yokoya et al.

[11] Patent Number: 5,559,443
[45] Date of Patent: Sep. 24, 1996

[54] JIG FOR MEASURING THE CHARACTERISTICS OF A SEMICONDUCTOR, MANUFACTURING METHOD FOR THE SAME, AND USAGE OF THE SAME

[75] Inventors: Yasuhiko Yokoya, Shimodate; Noboru Yamazaki, Minoo; Mitsuo Nakamura, Osaka; Syuuichi Hasuda; Eisaku Namai, both of Shimodate; Syuuzou Yamada, Osaka, all of Japan

[73] Assignees: Hitachi Chemical Company Ltd., Tokyo; Yamada Den-On Co., Ltd., Osaka, both of Japan

[21] Appl. No.: 399,220

[22] Filed: Mar. 6, 1995

[30] Foreign Application Priority Data

Mar. 7, 1994 [JP] Japan ..................... 6-035708

[51] Int. Cl.⁶ ..................... G01R 31/02
[52] U.S. Cl. ..................... 324/754; 324/755
[58] Field of Search ..................... 324/158.1, 73.1, 324/754, 755, 725, 765, 755; 439/482, 824; 437/8

[56] References Cited

U.S. PATENT DOCUMENTS

| | | | |
|---|---|---|---|
| 4,614,386 | 9/1986 | Driller et al. | 324/158.1 |
| 4,833,402 | 5/1989 | Boegh-Peterson | 324/754 |
| 4,835,465 | 5/1989 | Gergin | 324/754 |
| 4,870,356 | 9/1989 | Tingley | 324/754 |
| 4,912,401 | 3/1990 | Nady, II et al. | 324/755 |
| 4,922,190 | 5/1990 | Reinholz | 324/754 |
| 5,101,149 | 3/1992 | Adams et al. | 324/754 |

FOREIGN PATENT DOCUMENTS

| | | |
|---|---|---|
| 0142119 | 5/1985 | European Pat. Off. . |
| 0180013 | 5/1986 | European Pat. Off. . |
| 0227002 | 7/1987 | European Pat. Off. . |
| 0462706 | 12/1991 | European Pat. Off. . |
| 0468767 | 1/1992 | European Pat. Off. . |
| 2621131 | 3/1989 | France . |

OTHER PUBLICATIONS

Patent Abstracts Of Japan, vol. 16, No. 272 (E–1246), 11 Aug. 1992.
Patent Abstracts Of Japan, vol. 17, No. 684 (P–1661), 15 Dec. 1993.
Patent Abstracts Of Japan, vol. 14, No. 61 (P–1001), 5 Feb. 1990.
Patent Abstracts Of Japan, vol. 13, No. 517 (P–962) 20 Nov. 1989.

*Primary Examiner*—Vinh P. Nguyen
*Attorney, Agent, or Firm*—Antonelli, Terry, Stout & Kraus

[57] ABSTRACT

A jig for measuring the characteristics of various semiconductors has three main elements including a first circuit board to be connected to a tester for measuring the characteristics of the semiconductor, a second circuit board to be connected to the semiconductor and an intermediate board located between the first and second circuit boards. The first and second circuit boards are electrically connected together through springy pins. These pins, secured to the first circuit board, extend through the intermediate board via through holes to contact with terminals located in the second circuit board. When measuring the characteristics of various semiconductors it is possible to use the jig by replacing only the second circuit board with a board adapted to the particular semiconductor being measured without replacing the other elements of the jig.

16 Claims, 6 Drawing Sheets

JIG FOR MEASURING THE CHARACTERISTICS OF A SEMICONDUCTOR, MANUFACTURING METHOD FOR THE SAME, AND USAGE OF THE SAME

BACKGROUND OF THE INVENTION

1. Field of the Invention

The present invention relates to a jig used for an apparatus for measuring the operating characteristics of a semiconductor chip, a manufacturing method for the jig, and the usage of the jig.

2. Description of the Related Art

When a new specification has been decided for an electronic apparatus, which uses terminal equipment, personal computer, or the like, detailed design is first carried out, then logic design employing computer is carried out. After that, an actual large-scale integrated circuit (LSI) is designed according to the design requirements.

In these days, for such an LSI, a customized semiconductor chip, including a programmable gate array designed exclusively for a particular application, is often made rather than using a commercially available LSI which combines a gate and an integrated circuit.

An LSI tester is usually employed for measuring the operating characteristics of such semiconductor chips or memory semiconductor chips which are used in a large quantity. A testing machine has been developed, which is designed to supply power to the terminals of a semiconductor chip and generates a signal at a predetermined timing or reads a signal from the semiconductor chip to check whether the semiconductor chip operates as it is expected. Various types of testing machines are known as disclosed, for example, in "Very-large-scale circuit manufacturing/testing apparatuses" (on pages 165 through 197 of the supplementary volume of "Electronic Materials," of 1994 edition, issued by Japanese Industrial Standards Committee on Nov. 20, 1993). A typical apparatus for measuring the characteristics of a semiconductor employs a computer for issuing or reading a signal.

Such a testing machine often has a device-under-test (hereinafter referred to as "DUT") board whereon a semiconductor chip is mounted to be connected to the testing machine. The DUT board includes, as disclosed in Japanese Patent Laid-Open No. 63-36166, a semiconductor chip socket, a power supply, a grounding wire, and signal lines; it may further includes other electronic parts such as a resistor and a relay as necessary. These parts are disposed around the semiconductor socket and the signal lines extend radially from the socket, the major section of the DUT board forming a circle shape.

Further, Japanese Patent Laid-Open No. 63-78076 has disclosed a testing machine for wiring boards which uses springy contact terminals to be brought in contact with the connecting sections of a wiring board so as to carry out electrical testing.

In the testing machines described above, the DUT board must be prepared for each type of semiconductor device. In addition, there is an increasing demand for a higher testing speed, e.g. 100 MHz or more. For these reasons, highly demanding conditions are given to the characteristic impedance and crosstalk of a wiring pattern, resulting in a considerably expensive wiring board. Furthermore, the whole DUT board has to be changed whenever a different type of semiconductor device is tested, requiring much time for re-connection.

SUMMARY OF THE INVENTION

Accordingly, it is an object of the present invention to provide a jig for measuring a semiconductor device, a manufacturing method for the jig, and the usage of the jig which are economical and which permit highly efficient changing work.

To this end, according to the present invention, there is provided a measuring jig for a semiconductor device, comprising a first circuit board 1, an intermediate board 2, and a second circuit board 3, the first circuit board 1 being provided with a first group of terminals 11 to be connected to a measuring instrument or power supply or the like, a second group of terminals 13 to be connected to the circuit board 3, and a group of wiring conductors 12 for making electrical connection between the first group of terminals 11 and the second group of terminals 13, the second circuit board 3 being provided with a third group of terminals 31 to be connected to the first circuit board 1 which are located in a position matching to the position of the second group of terminals 13 of the circuit board 1, a fourth group of terminals 33 to be connected to a semiconductor device to be mounted on the second circuit board 3 or to the socket for connection with a semiconductor device, and a group of wiring conductors 32 for electrical connection between the third group of terminals 31 and the fourth group of terminals 33, the intermediate board 2 being provided with an insulated plate which has a plurality of through holes 21 with metallized inner walls which are located in positions matching to the positions of the second group of terminals 13 and the third group of terminals 31, and springy pins 22 which are inserted in the through holes 21 and which are isolated from the inner walls thereof.

In this case, an insulating material is preferably provided between the inner wall and the pin 22 in a through hole 21, which is provided in the intermediate board 2, to restrict the characteristic impedance of a coaxial line structure formed by the pin 22 and the metal layer of the inner wall within a predetermined range.

As the intermediate board 2 according to the present invention, there may be used a plurality of insulating boards 201 which are provided with through holes 21 having metallized inner walls. This makes it possible to increase the ratio of the hole diameter to the hole length (hereinafter referred to as "aspect ratio") of the insulating board 201, thereby ensuring good adhesion of plating. Further, the intermediate board 2 may comprise a plurality of insulating boards 201 which are provided with through holes 21 with metallized inner walls and a metal plate 202. The circuit board 1 and the metal plate 202 of the intermediate board 2 are fixed with screws to ensure stable measurement.

A metal board 92 may be used in place of the intermediate board 2, which metal board has the same shape as that of the intermediate board 2, that is, the metal board has a plurality of through holes 21 in the positions corresponding to those of the group of terminals 13 and the group of terminals 31 and has pins 22 in the plurality of through holes 21, the pins 22 being insulated from the inner walls of the through holes 21. The pins 22 may be fixed to the circuit board 1 in advance by soldering or the like.

The use of the metal board 92 is not preferable because it makes the weight of the jig large. However, in a case where the number of the terminals is small, the number of the through holes 21 (through which the pins 22 extend) provided in the metal board 92 becomes small, so that the weight thereof can be reduced by cutting off metal board portions other than portions where the through holes 21 are formed. In addition, the metal board can be readily formed only by the working of a metal plate. Thus, by using the metal board, it is possible to reduce the cost thereof.

In the circuit board 1, each of at least signal wiring conductors 12 among the wiring conductors between the group of terminals 11 and the group of terminals 13 is preferably formed to have the same length. This permits the same delay between signals with resultant high reliability of measurement. Likewise, in the circuit board 3, each of at least signal wiring conductors among the wiring conductors 32 between the group of terminals 31 and the group of terminals 33 is preferably formed to have the same length.

The metal layer formed on the inner wall of the through hole 21 or an intermediate metal board may be preferably connected to a circuit power supply or the ground in order to suppress crosstalk or noise or to maintain the line characteristic impedance from the pin at a constant level.

The jig for measuring a semiconductor described above can be manufactured by the steps of: preparing the circuit board 1 which has the group of terminals 11 to be connected to a measuring instrument or a power supply or the like, the group of terminals 13 to be connected to the circuit board 3, and the group of wiring conductors 12 for making electrical connection between the group of terminals 11 and the group of terminals 13; preparing the circuit board 3 having the group of terminals 31 which is connected to the circuit board 1 and which is located at a place corresponding to that of the group of terminals 13 of the circuit board 1, the group of terminals 33 to be connected to a semiconductor device to be mounted at least on the circuit board 3 or to the socket for connection with a semiconductor device, and the group of wiring conductors 32 for electrical connection between the group of terminals 31 and the group of terminals 33; preparing the intermediate board 2 which has the through holes 21 in the positions corresponding to those of the group of terminals 13 and the group of terminals 31, the inner walls of the through holes being metallized; fixing a plurality of pins 22 on the group of terminals 13 of the circuit board 1; and fixing the intermediate board 2 to the circuit board 1 so that a plurality of springy pins 22 do not come in-contact with the through holes 21.

As disclosed in U.S. Pat. No. 3,674,914, the circuit board 1 and/or the circuit board 3 may comprise an adhesive layer on the surface of an insulated board or on the insulated surface of a board having an inner layer circuit, and wires coated with insulators and provided with adhesive layers, which wires are secured onto the surface in a desired configuration through activating of the adhesive by supersonic waves. Further, in the intermediate board 2, an insulating plastic spacer having a diameter which is approximately equal to or smaller than that of the through hole 21 may be provided around the pin 22 so as to prevent the plurality of pins 22 from contacting the through holes 21. The same effect can be achieved by filling the gap between the pin 22 and the inner wall of the through hole 21 with a plastic insulator after fixing the intermediate board 2 to the circuit board 1. The plastic insulator is preferably tetrafluoroethylene which ensures stable frequency response in the high frequency area.

When using such a jig for measuring a semiconductor, a single circuit board 1 and a single intermediate board 2 are prepared, and various circuit boards 3 are also prepared in accordance with the types of the semiconductor devices to be measured, whereby two or more types of semiconductors can be measured by replacing the circuit board 3 while maintaining a measuring circuit or a power circuit or the like connected to the circuit board 1.

DESCRIPTION OF THE PREFERRED EMBODIMENTS

First Embodiment

Figure 1A:
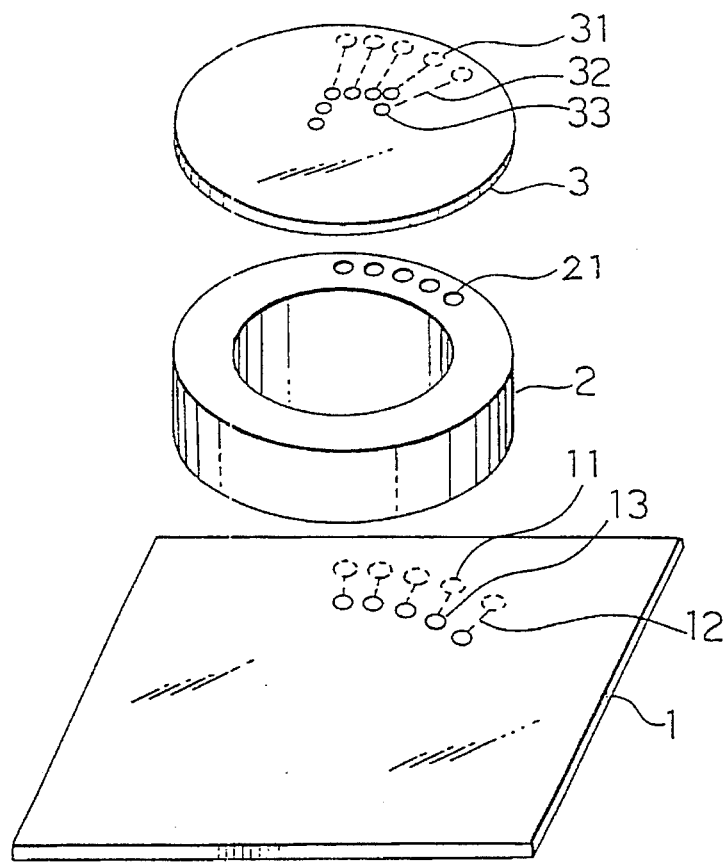
FIG. 1A is a schematic exploded perspective view for illustrating an embodiment of the present invention and FIG. 1B is a schematic partial cross-sectional view of a jig of the invention.

As shown in FIG. 1A, the DUT board according to the first embodiment employs a performance board as the circuit board 1, a ring board as the intermediate board 2, and a socket board as the circuit board 3.

Figure 4A:
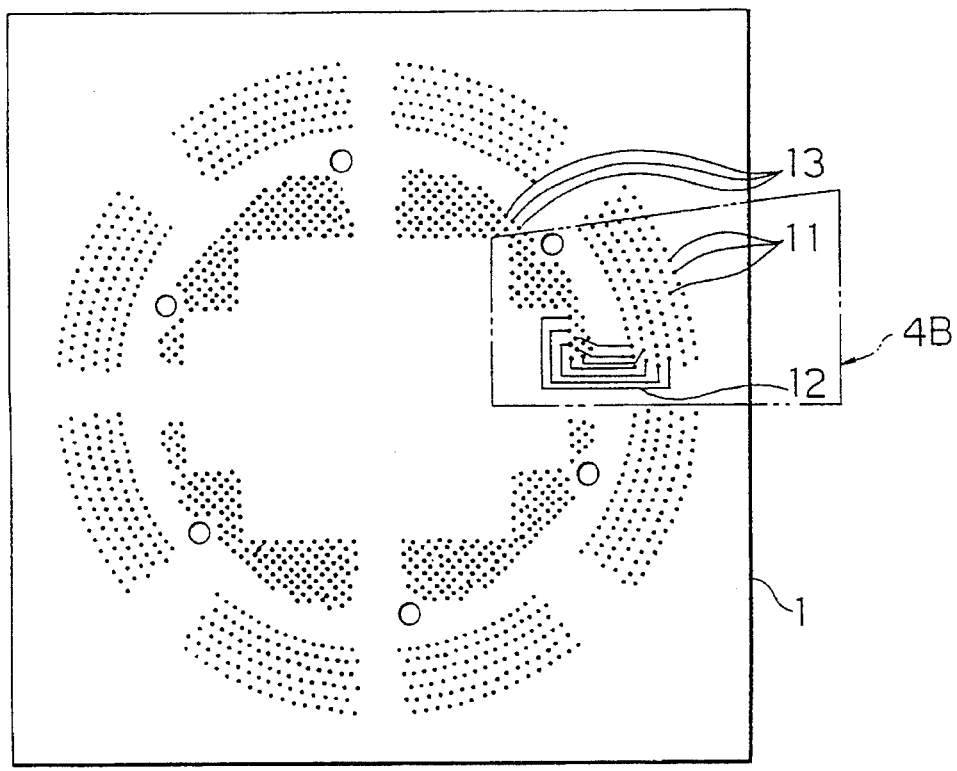
FIG. 4A is a top view illustrative of a circuit board 1 of an embodiment of the present invention and FIG. 4B is a partially cut-away, enlarged top view of a portion "4B" in the circuit board 1.
Figure 4B:
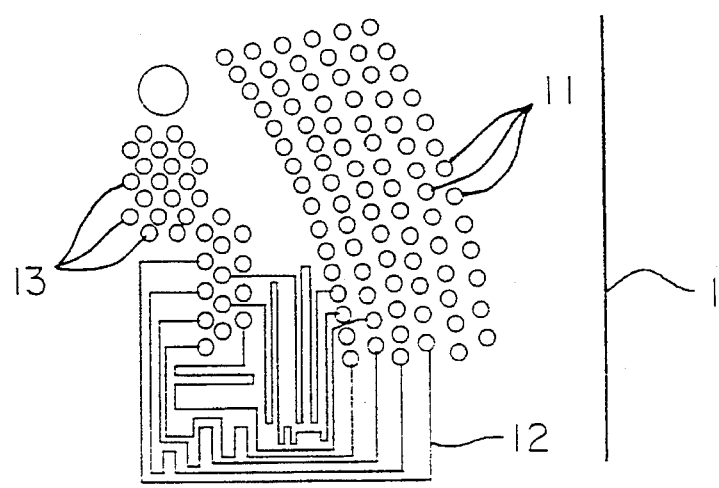

As shown in FIG. 4, the circuit board 1 (performance board) is constituted by a multi-wire board which is made by the steps of providing an adhesive layer on the surface of an insulated board or on the insulated surface of a board having an inner layer circuit, and securing wires, which are covered with insulators and which have adhesive layers, onto the surface in a desired configuration while activating the adhesive by supersonic waves. The multi-wire board includes a group of terminals 11 to be connected to a measuring instrument or power supply or the like, a group of terminals 13 to be connected to the circuit board 3, and a group of wiring conductors 12 for making electrical connection between the group of terminals 11 and the group of terminals 13. Further, each of at least signal wiring conductors among the wiring conductors located between the group of terminals 11 and the group of terminals 13 is formed to have the same length.

Figure 5A:
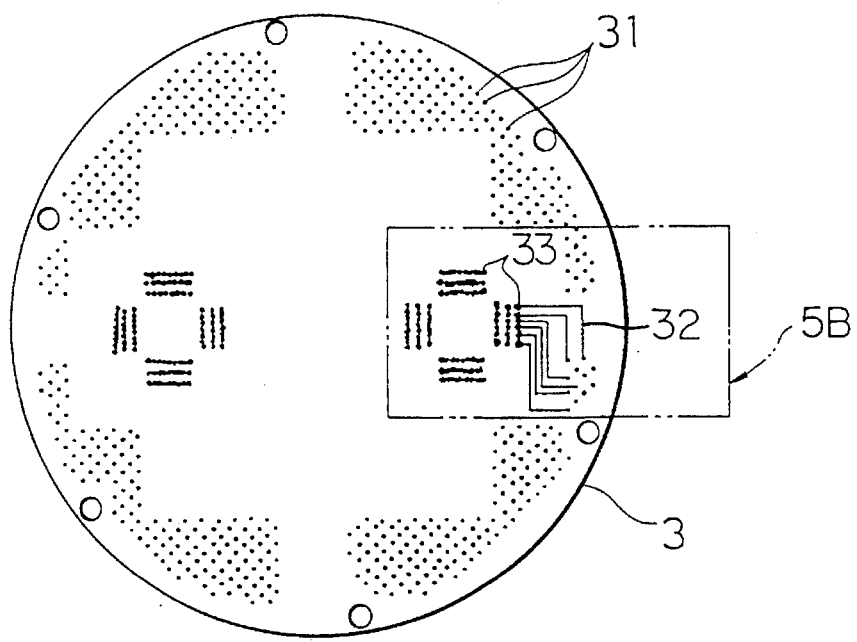
FIG. 5A is a top view illustrative of a circuit board 3 of an embodiment of the present invention and FIG. 5B is a partially cut-away, enlarged top view of a portion "5B" in the circuit board 3.
Figure 5B:
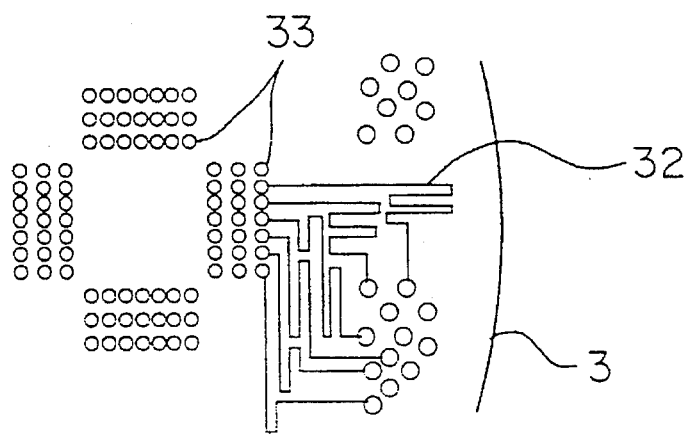

As in the case of the circuit board 1, the circuit board 3 (socket board) also employs the multiwire board as shown in FIGS. 5A and 5B. The circuit board 3 includes the group of terminals 31 to be connected to the circuit board 1 which are located in a position corresponding to the position of the group of terminals 13 of the circuit board 1, the group of terminals 33 to be connected to a semiconductor device to be mounted at least on the circuit board 3 or to the socket for connection with a semiconductor device, and the group of wiring conductors 32 for electrical connection between the group of terminals 31 and the group of terminals 33. Each of at least all signal wiring conductors among the wiring conductors between the group of terminals 31 and the group of terminals 33 is formed to have the same length.

Figure 2A:
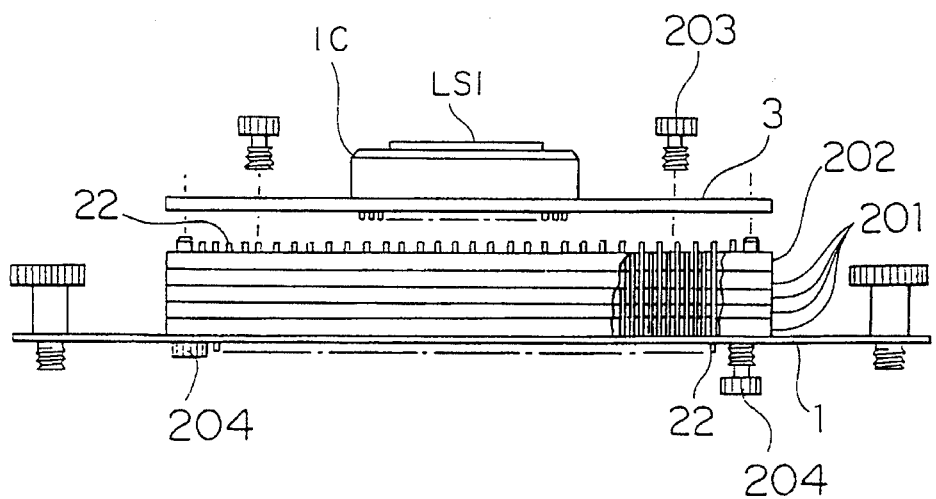
FIGS. 2A and 2B are side views illustrative of the structures of embodiments of the present invention.
Figure 2B:
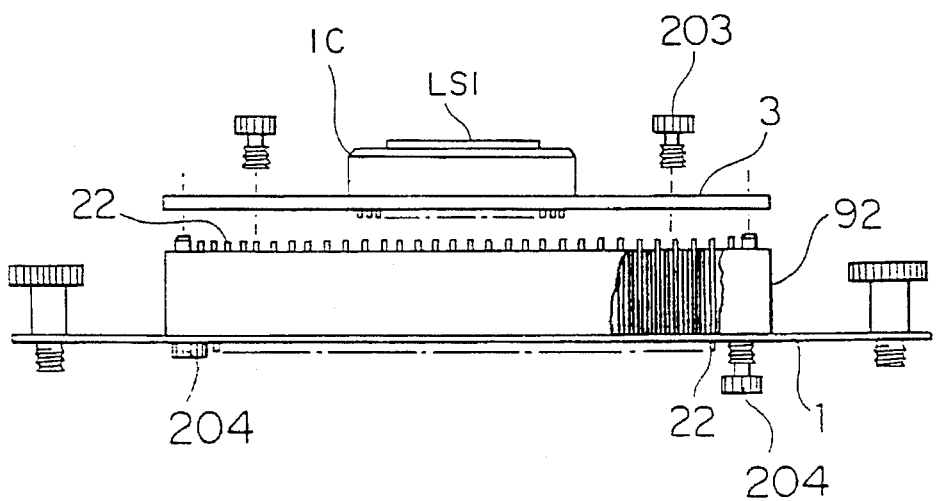
Figure 6:
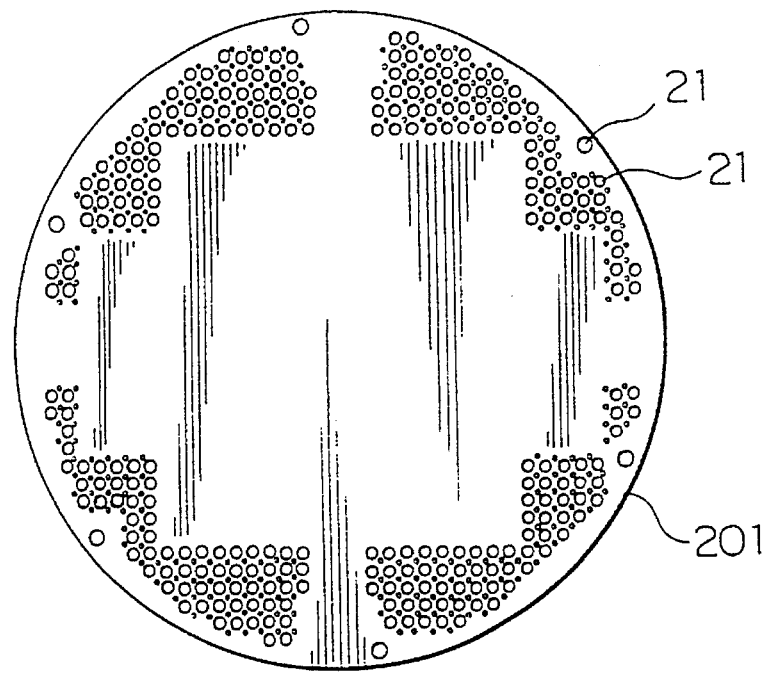
FIG. 6 is a top view illustrative of a ring board of an intermediate board 2 of an embodiment of the present invention.
Figure 7:
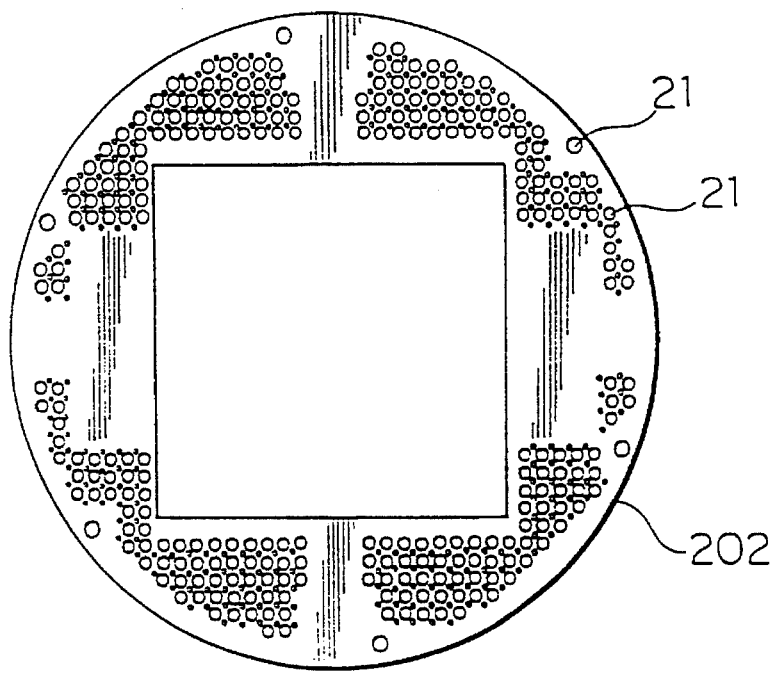
FIG. 7 is a top view illustrative of a spacer ring of the intermediate board 2 of an embodiment of the present invention.

The intermediate board 2 comprises four ring boards 201 and one spacer ring 202 as illustrated in FIG. 2. As shown in FIG. 6, each ring board 201 employs an insulated board as the main material and it has through holes 21 in positions where springy pins 22 are installed, the through holes having a diameter which is larger than that of the pins 22. The inner walls of the through holes and the whole surface of the board are provided with copper plating and solder plating. In the spacer ring 202 made of aluminum alloy, as illustrated in FIG. 7, the area, which corresponds to the area for a socket or electronic components to be mounted on the circuit board 3, is punched out and the through holes for pins are provided by drilling, milling or boring to make the through holes on the aluminum board. The spacer ring is further provided with female screws for fixing the circuit board 1 and the intermediate board 2, or the circuit board 3 and the intermediate board 2.

Figure 1B:
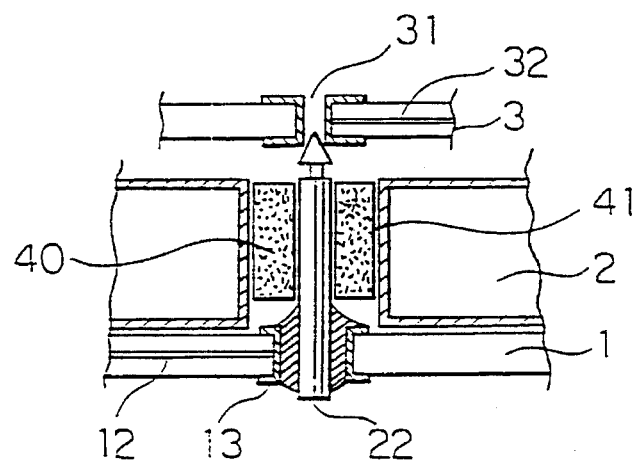
Figure 3A:
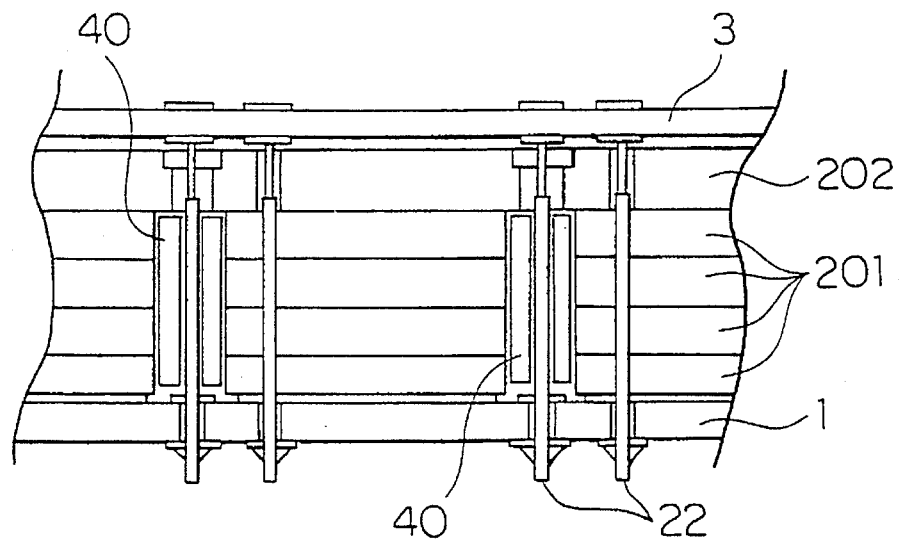
FIGS. 3A and 3B are cross-sectional views illustrative of each part of the jigs of the present invention.
Figure 3B:
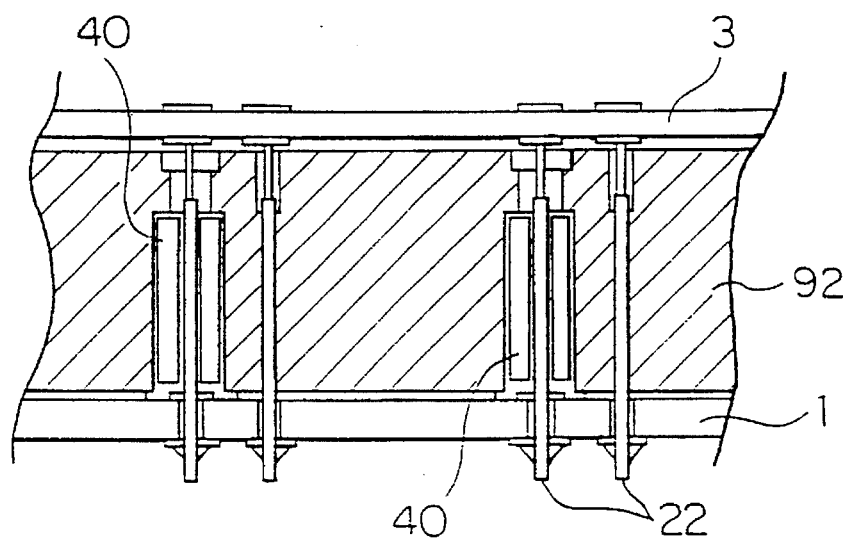

As illustrated in FIG. 1B, each springy pin 22 is soldered and fixed in a predetermined location in the circuit board 1 thus prepared. Then, as illustrated in FIG. 3A, a tetrafluoroethylene bushing 40 is disposed around each pin, and the four ring boards are stacked on them and further the spacer ring 202 is placed on them at the end. Fixing screws 204 are inserted from the back of the circuit board 1 into the female screws provided on the spacer ring 202.

At this time, each springy pin 22 slightly is protruded out from the through hole in the spacer ring 202 as shown in FIG. 2, but it retracts to be flush with the spacer ring when it is pushed by the finger.

Each of different types of circuit board 3 is prepared to match each of different semiconductor devices to be tested. A circuit board 3 selected therefrom is located in place on the spacer ring 202 by using guide pins provided on the spacer ring, then it is fixed by installing the screws 203 through the through holes in the circuit board 3 into the female screws provided on the spacer ring 202. This electrically connects the group of terminals 13 of the circuit board 1 to the group of terminals 31 of the circuit board 3 through the springy pins.

The terminals of the testing machine were connected to the terminals provided on the circuit board 1 to carry out testing. The testing results indicated that the variations in the characteristic impedance were as low as ±10% or less with respect to a set value because of coaxial lines formed by both the intermediate board 2 and the pins. The crosstalk was also as low as 0.5% or less.

Second Embodiment

The circuit boards for the second embodiment were made in the same manner as in the first embodiment except that the thickness of the insulating layer located between the inner layer circuit and the insulated wire is controlled so as to make a characteristic impedance be within the range of $50\Omega \pm 5\Omega$ regarding the circuit board 1 (performance board) and the circuit board 3 (socket board).

In the intermediate board 2, taking the pin diameter and the through hole diameter of the ring board into account, the thickness of the tetrafluoroethylene bushing was set to make a characteristic impedance be in the range of $50\Omega \pm 5\Omega$. The aforesaid ring boards and the spacer ring were electrically connected with the grounding layers of the circuit board 1 and the circuit board 3.

The terminals of the testing machine were connected to the terminals provided on the circuit board 1 to carry out testing. The testing results indicated that the variations in the characteristic impedance were as low as ±3Ω or less with respect to a set value of 50Ω because of the coaxial lines formed by both the intermediate board 2 and the pins. The crosstalk was also as low as 0.5% or less.

Third Embodiment

The DUT board according to the third embodiment employs a performance board as the circuit board 1, a ring board as the intermediate board 2, and a socket board as the circuit board 3.

The circuit board 1 (performance board) is constituted by a plurality of inner layer circuits which have a signal layer, a power layer, and a grounding layer and which are stacked as prepregs, then they are heated and pressed to form them into a single laminated board. The board is then formed into a multilayer printed wiring board by the steps of providing through holes, copper plating, and removing unnecessary copper by etching, thus producing the wiring conductor. The printed wiring board includes the group of terminals 11 to be connected to a measuring instrument or power supply or the like, the group of terminals 13 to be connected to the circuit board 3, and the group of wiring conductors 12 for making electrical connection between the group of terminals 11 and the group of terminals 13. Each of at least signal wiring conductors among the wiring conductors connecting the group of terminals 11 and the group of terminals 13 is formed to have the same length.

The circuit board 3 (socket board) also employs a multilayer printed wiring board as in the case of the circuit board 1, which board 3 comprises the group of terminals 31 which is connected to the circuit board 1 and which is located in a position corresponding to the position of the group of terminals 13 of the circuit board 1, the group of terminals 33 to be connected to a semiconductor device to be mounted at least on the circuit board 3 or to the socket for connection with a semiconductor device, and the group of wiring conductors 32 for making electrical connection between the group of terminals 31 and the group of terminals 33. Each of at least signal wiring conductors among the wiring conductors connecting the group of terminals 11 and the group of terminals 13 is formed to have the same length.

The intermediate board 2 is formed of a single ring board made of an aluminum alloy and a single spacer ring. The ring board has through holes in positions where springy pins are installed, the through holes having a diameter which is larger than that of the pins. In the spacer ring, the area, which corresponds to the area for a socket and electronic components to be mounted on the circuit board 3, is punched out and the through holes for pins are provided as in the case of the aforesaid ring board.

A springy pin is soldered and fixed in a predetermined location in the circuit board 1 thus prepared. Then, a tetrafluoroethylene bushing is disposed around each pin, and the four ring boards are stacked on them and further the spacer ring is placed on them at the end. Fixing screws 204 are inserted from the back of the circuit board 1 into the female screws provided on the spacer ring.

At this time, each springy pin slightly is protruded out from the through hole in the spacer ring, but it retracts to be flush with the spacer ring when it is pushed by the finger.

Each of different types of circuit board 3 is prepared to match each of different semiconductor devices to be tested. A proper circuit board 3 selected therefrom is placed and positioned on the spacer ring through guide pins provided on the spacer ring, then it is fixed by installing the screws 203 through the through holes in the circuit board 3 into the female screws provided on the spacer ring. This electrically connects the group of terminals 13 of the circuit board 1 to the group of terminals 31 of the circuit board 3 through the springy pins.

The terminals of the testing machine were connected to the terminals provided on the circuit board 1 to carry out testing. The testing results indicated that the variations in the characteristic impedance were as low as ±10% or less with respect to a set value because of the coaxial lines formed by the intermediate board 2 and the pins. The crosstalk was also as low as 0.5% or less.

Thus, according to the present invention, even when there are different types of semiconductor devices to be tested, the testing for all the semiconductor devices can be accomplished simply by changing the circuit board 3. Furthermore, since the coaxial lines are formed by the intermediate board and the pins, crosstalk and the variations in the delay in the signal lines can be controlled to a minimum. In addition, the jig used for such a purpose can be manufactured efficiently.

What is claimed is:

1. A jig for measuring the characteristics of a semiconductor, comprising:

a first circuit board, an intermediate board, and a second circuit board;

said first circuit board comprising a multi-wire board having a first group of terminals to be connected to a measuring instrument or a power supply, a second group of terminals to be connected to the second circuit board, and a group of wiring conductors for making electrical connection between the first group of terminals and the second group of terminals;

said second circuit board comprising a multi-wire board having a third group of terminals to be connected to the second group of terminals of the first circuit board, said third group of terminals being located in a position corresponding to a position of the second group of terminals of the first circuit board, a fourth group of terminals to be connected to a semiconductor chip to be mounted at least on the second circuit board or to a socket for connection with a semiconductor chip, and another group of wiring conductors for making electrical connection between the third group of terminals and the fourth group of terminals; and the intermediate board being located between the first and second circuit boards, said intermediate board comprising an insulated board which has a plurality of through holes with metallized inner walls in positions matching to corresponding positions of the second group of terminals of the first circuit board and the third group of terminals of the second circuit board and springy pins which are inserted in the through holes and which are isolated from the metallized inner walls thereof.

2. A jig for measuring the characteristics of a semiconductor according to claim 1, further comprising an insulating material disposed between a metallized inner wall of each through hole provided in the intermediate board and each pin.

3. A jig for measuring the characteristics of a semiconductor according to claim 1 or 2, wherein the intermediate board comprises a plurality of insulated boards having through holes with metallized inner walls.

4. A jig for measuring the characteristics of a semiconductor according to claim 1 or 2, wherein the intermediate board comprises a plurality of insulating boards having through holes with metallized inner walls and a metal plate located at a side spaced apart from the first circuit board, the first circuit board and the metal board of the intermediate board being fixed together with screws.

5. A jig for measuring the characteristics of a semiconductor according to claim 1, wherein the group of wiring conductors between the first group of terminals and the second group of terminals of the first circuit board comprises a plurality of signal wiring conductors formed to have the same length in the first circuit board.

6. A jig for measuring the characteristics of a semiconductor according to claim 1, wherein the another group of wiring conductors between the third group of terminals and the fourth group of terminals of the second circuit board comprises a plurality of signal wiring conductors formed to have the same length in the second circuit board.

7. A jig for measuring the characteristics of a semiconductor according to claim 1, wherein a metal layer formed on the metallized inner wall of the through hole is connected to a circuit power supply or the ground.

8. A jig for measuring the characteristics of a semiconductor comprising:

a first circuit board, an intermediate board, and a second circuit board;

said first circuit board comprising a multi-wire board having a first group of terminals to be connected to a measuring instrument or a power supply, a second group of terminals to be connected to the second circuit board, and a group of wiring conductors for making electrical connection between the first group of terminals and the second group of terminals;

said second circuit board comprising a multi-wire board having a third group of terminals to be connected to the second group of terminals of the first circuit board, said third group of terminals being located in a position corresponding to a position of the second group of terminals of the first circuit board, a fourth group of terminals to be connected to a semiconductor chip to be mounted at least on the second circuit board or to a socket for connection with a semiconductor chip, and another group of wiring conductors for making electrical connection between the third group of terminals and the fourth group of terminals; and the intermediate board being located between the first and second circuit boards, said intermediate board comprising a metal board having a plurality of through holes located in positions matching to positions of the second group of terminals and the third group of terminals and pins are provided which are located in the plurality of through holes and which are isolated from inner walls thereof.

9. A jig for measuring the characteristics of a semiconductor according to claim 1 or 8, wherein the pins are fixed to the first circuit board.

10. A jig for measuring the characteristics of a semiconductor according to any one of claims 1 or 8, wherein the characteristic impedance of the wiring conductors on the first circuit board and said second circuit board is matched to the characteristic impedance of the pins of the intermediate board.

11. A jig for measuring the characteristics of a semiconductor according to claim 10, wherein the metal board is connected to a circuit power supply or the ground.

12. A manufacturing method of a jig for measuring the characteristics of a semiconductor, comprising the steps of:

preparing a first circuit board which includes a multiwire board having a first group of terminals connected to a measuring instrument or a power supply, a second group of terminals to be connected to a second circuit board, and a group of wiring conductors for making electrical connection between the first group of terminals and the second group of terminals;

preparing the second circuit board which includes a multi-wire board having a third group of terminals to be connected to the first circuit board which are located in a position corresponding to a position of the second group of terminals of the first circuit board, a fourth group of terminals to be connected to a semiconductor chip to be mounted at least on the second circuit board or to a socket for connection with a semiconductor chip, and a group of wiring conductors for making electrical connection between the third group of terminals and the fourth group of terminals;

preparing an intermediate board to be located between the first and second circuit boards, said intermediate board including through holes with metallized inner walls, the through holes being located in positions corresponding to positions of the second group of terminals and the third group of terminals;

fixing a plurality of springy pins to the second group of terminals of the first circuit board; and fixing the intermediate board to the first circuit board so that each of the pins is not in contact with the metallized inner walls of each of the through holes; said pins extending through the through holes.

13. A manufacturing method of a jig for measuring the characteristics of a semiconductor according to claim 12, wherein at least one of the first circuit board and the second circuit board is manufactured by the steps of providing an adhesive layer on the surface of an insulated board or on the insulated surface of a board having an inner layer circuit, and securing a wire, which is coated with an insulator and which has an adhesive layer, onto the surface thereof in a desired configuration while activating the adhesive by supersonic waves.

14. A manufacturing method of a jig for measuring the characteristics of a semiconductor according to claim 12 or 13, wherein an insulating plastic spacer having a diameter which is approximately equal to or smaller than that of the through hole is located around each pin as a means for preventing each pin from contacting a metallized wall of each through hole in the intermediate board.

15. A manufacturing method of a jig for measuring the characteristics of a semiconductor according to claim 12 or 13, wherein the gap between the pin and the inner wall of a through hole is filled with a plastic insulator after fixing the intermediate board to the first circuit board, the plastic insulator serving as a means for preventing each pin from contacting a metallized wall of each through hole in the intermediate board.

16. A manufacturing method of a jig for measuring the characteristics of a semiconductor according to claim 15, wherein the plastic insulator is made of tetrafluoroethylene.

* * * * *